US012615786B2

(12) United States Patent
Leng

(10) Patent No.: US 12,615,786 B2
(45) Date of Patent: Apr. 28, 2026

(54) METAL-INSULATOR-METAL (MIM) CAPACITOR MODULE

(71) Applicant: Microchip Technology Incorporated, Chandler, AZ (US)

(72) Inventor: Yaojian Leng, Vancouver, WA (US)

(73) Assignee: Microchip Technology Incorporated, Chandler, AZ (US)

( * ) Notice: Subject to any disclaimer, the term of this patent is extended or adjusted under 35 U.S.C. 154(b) by 763 days.

(21) Appl. No.: 17/856,183

(22) Filed: Jul. 1, 2022

(65) Prior Publication Data

US 2023/0395649 A1 Dec. 7, 2023

Related U.S. Application Data

(60) Provisional application No. 63/349,703, filed on Jun. 7, 2022.

(51) Int. Cl.
H10D 1/00 (2025.01)
H01L 21/768 (2006.01)
(Continued)

(52) U.S. Cl.
CPC ....... H10D 1/042 (2025.01); H01L 21/76802 (2013.01); H01L 23/5223 (2013.01); H01L 23/5226 (2013.01); H10D 1/716 (2025.01)

(58) Field of Classification Search
CPC ............. H01L 23/5222; H01L 23/5223; H01L 21/76802; H10D 1/692
See application file for complete search history.

(56) References Cited

U.S. PATENT DOCUMENTS 6,025,226 A * 2/2000 Gambino ............... H10D 1/692
257/E21.585
8,389,355 B2 * 3/2013 Won ..................... H10D 84/811
438/238
(Continued)

FOREIGN PATENT DOCUMENTS

KR 20060061471 A 6/2006

OTHER PUBLICATIONS

Pan, "Copper CMP and Process Control", 1999, CMP-MIC 99 Conference, pp. 1 and 2 (Year: 1999).*
(Continued)

*Primary Examiner* — Fernando L Toledo
*Assistant Examiner* — Adam S Bowen
(74) *Attorney, Agent, or Firm* — SLAYDEN GRUBERT BEARD PLLC

(57) ABSTRACT

A metal-insulator-metal (MIM) capacitor includes a bottom electrode, an insulator cup formed on the bottom electrode, a top electrode formed in an opening defined by the insulator cup, a top electrode connection element electrically connected to the top electrode, a vertically-extending bottom electrode contact electrically connected to the bottom electrode, and a bottom electrode connection element electrically connected to the vertically-extending bottom electrode contact. The bottom electrode is formed in a lower metal layer. The insulator cup is formed in a tub opening in a dielectric region and includes a laterally extending insulator cup base formed on the bottom electrode and a vertically-extending insulator cup sidewall extending upwardly from the laterally extending insulator cup base. The top electrode connection element and bottom electrode connection element are formed in an upper metal layer.

15 Claims, 12 Drawing Sheets

(51) Int. Cl.
    *H01L 23/522*      (2006.01)
    *H10D 1/68*       (2025.01)

(56)              References Cited

U.S. PATENT DOCUMENTS

2006/0157766 A1 *  7/2006  Won ........................ H10D 1/692
                                     257/E21.59
2010/0224925 A1 *  9/2010  Ching .................... H10D 1/042
                                     257/532
2013/0234288 A1 *  9/2013  Gu ......................... H10D 1/692
                                     257/532
2017/0213896 A1 *  7/2017  Lisiansky ......... H01L 21/28088
2020/0328271 A1 * 10/2020  Gambino ............ H01L 23/5223
2021/0265263 A1    8/2021  Leng

OTHER PUBLICATIONS

International Search Report and Written Opinion, Application No. PCT/US2022/036759, 13 pages.

* cited by examiner

METAL-INSULATOR-METAL (MIM) CAPACITOR MODULE

RELATED PATENT APPLICATION

This application claims priority to commonly owned U.S. Provisional Patent Application No. 63/349,703 filed Jun. 7, 2022, the entire contents of which are hereby incorporated by reference for all purposes.

TECHNICAL FIELD

The present disclosure relates to metal-insulator-metal (MIM) capacitors formed in integrated circuit devices, and more particularly, to a MIM capacitor module formed in an integrated circuit device.

BACKGROUND

A metal-insulator-metal (MIM) capacitor is a capacitor constructed with a metal top electrode, a metal bottom electrode, and an insulator (dielectric) sandwiched between the two electrodes.

MIM capacitors are important components in many electrical circuits, for example many analog, mixed-signal, and radio-frequency complementary metal-oxide semiconductors (RF CMOS) circuits. MIM capacitors typically provide better performance than alternatives, such as POP (poly-oxide-poly) capacitors and MOM (metal-oxide-metal lateral flux) capacitors, due to lower resistance, better matching for analog circuits (e.g., matching device characteristics such as resistance and capacitance), and/or better signal/noise characteristics.

MIM capacitors are typically constructed between two interconnect metal layers (e.g., aluminum layers), referred to as metal layers $M_x$ and $M_{x+1}$. For example, an MIM capacitor may be formed using an existing metal layer $M_x$ as the bottom plate (bottom electrode), constructing an insulator and a top plate (top electrode) over the bottom electrode, and connecting an overlying metal layer $M_{x+1}$ to the top and bottom plates by respective vias to form a MIM capacitor module. The top plate formed between the two metal layers $M_x$ and $M_{x+1}$ may be formed from a different metal than the metal layers $M_x$ and $M_{x+1}$. For example, the metal layers $M_x$ and $M_{x+1}$ may be formed from aluminum, whereas the top plate may be formed from titanium/titanium nitride (Ti/TiN), tantalum/tantalum nitride (Ta/TaN), or tungsten (W), for example.

The top electrode typically has a higher resistance than the bottom electrode, for example because the top electrode may be limited by thickness constraints and the material of choice, thus limiting the performance of conventional MIM capacitors. MIM capacitors typically have very narrow process margins, particularly for a metal etch used to form the top electrode.

Conventional MIM capacitors are also typically expensive to build. For example, MIM capacitors typically require multiple additional mask layers and many additional process steps.

In addition, for MIM capacitors formed in aluminum interconnect (i.e., where metal layers $M_x$ and $M_{x+1}$ comprise aluminum interconnect layers), the aluminum bottom electrode may be susceptible to hillock formation at a top side of the bottom electrode, e.g., resulting from high-temperature processing of aluminum, a low-melting-point metal.

Hillocks formed on the bottom electrode may negatively or unpredictably affect the breakdown voltage of the MIM capacitor.

There is a need for MIM capacitors that can be manufactured at lower cost, with few or no added mask layers, and/or with improved breakdown voltage.

SUMMARY

A metal-insulator-metal (MIM) capacitor includes a bottom electrode, an insulator cup formed on the bottom electrode, a top electrode formed in an opening defined by the insulator cup, a top electrode connection element electrically connected to the top electrode, a vertically-extending bottom electrode contact electrically connected to the bottom electrode, and a bottom electrode connection element electrically connected to the vertically-extending bottom electrode contact. The bottom electrode is formed in a lower metal layer. The insulator cup is formed in a tub opening in a dielectric region of a via layer, and includes a laterally extending insulator cup base formed on the bottom electrode and a vertically-extending insulator cup sidewall extending upwardly from the laterally extending insulator cup base. The top electrode connection element and bottom electrode connection element may be formed in an upper metal layer over the via layer.

As used herein, a "MIM capacitor module" includes the fundamental elements of an MIM capacitor, e.g., an insulator (dielectric) arranged between conductive electrodes (e.g., conductive plates), and may also include certain related elements, e.g., conductive elements providing electrical contact to the conductive electrodes.

In some examples, the top electrode is capacitively coupled to the bottom electrode through the laterally-extending insulator cup base. The vertically-extending insulator cup sidewall may be surrounded by the dielectric region in lateral directions, which may substantially prevent capacitive coupling between the top electrode and other conductive structures (e.g., the bottom electrode and/or the vertically-extending bottom electrode contact) through the vertically-extending insulator cup sidewall. Thus, the structure of the MIM capacitor module effectively defines a planar capacitor between the top electrode and bottom electrode through the laterally-extending insulator cup base. This planar capacitor defined by the structure of MIM capacitor module may be suitable or advantageous for particular applications, e.g., for use in analog circuits.

In some examples, a process for forming the MIM capacitor module involves depositing a dielectric region including a base dielectric component and a sacrificial dielectric component over the base dielectric component, wherein the sacrificial dielectric component allows for removal of non-planar recessed regions (e.g., "plug recesses") at the top of respective metal structures (e.g., vertical tungsten structures), by a planarization process, to thereby provide planarized upper surfaces suitable for connection to overlying metal structures.

In some examples, the vertically-extending bottom electrode contact is laterally spaced apart from the top electrode by a sufficient distance to allows the formation of both a top electrode connection element (e.g., formed on a top surface of the top electrode) and a bottom electrode connection element (e.g., formed on a top surface of the vertically-extending bottom electrode contact) in a common (i.e., same) metal layer without the need for additional mask layers.

In some examples, the MIM capacitor module may be constructed concurrently with an interconnect structure. In some examples, the MIM capacitor module may be constructed using a damascene process without added photomask layers, as compared with a background IC fabrication process.

In some examples the MIM capacitor module provides a consistent breakdown voltage. For example, disclosed processes for forming the MIM capacitor module may avoid the presence of hillocks on the bottom electrode. In addition, the thickness of the top electrode and overlying top electrode connection pad (which, for example, can both be formed from aluminum) may be large, this providing a very low series resistance.

In some examples, the MIM capacitor module may be constructed between two metal interconnect layers, or between a silicided polysilicon layer and a metal-1 metal layer.

One aspect provides a MIM capacitor module including a bottom electrode formed in a lower metal layer, and an insulator cup formed in a tub opening in a dielectric region above the lower metal layer and including a laterally extending insulator cup base formed on the bottom electrode and a vertically-extending insulator cup sidewall extending upwardly from the laterally extending insulator cup base. The MIM capacitor module includes a top electrode formed in an opening defined by the insulator cup, a vertically-extending bottom electrode contact formed in the dielectric region and contacting the bottom electrode, and a top electrode connection element and a bottom electrode connection element formed in an upper metal layer, wherein the top electrode connection element is electrically connected to the top electrode and the bottom electrode connection element is electrically connected to the vertically-extending bottom electrode contact.

In some examples, the lower metal layer and the upper metal layer respectively comprise metal interconnect layers.

In some examples, the lower metal layer comprises a silicided polysilicon layer, wherein the bottom electrode comprises a metal silicide formed on a polysilicon structure.

In some examples, the bottom electrode and the vertically-extending bottom electrode contact are formed from different metals.

In some examples, the bottom electrode is formed from aluminum, and the vertically-extending bottom electrode contact is formed from tungsten.

In some examples, the laterally extending insulator cup base is formed directly on the bottom electrode.

In some examples, the vertically-extending insulator cup sidewall is formed directly on a vertically-extending surface of the dielectric region.

Another aspect provides an integrated circuit (IC) device including an IC structure and a MIM capacitor module. The IC structure incudes a lower metal element formed in a lower metal layer, an upper metal element formed in an upper metal layer, and a vertically-extending metal element formed in a dielectric region and electrically connected between the lower metal element and the upper metal element, the dielectric region formed between the lower metal layer and the upper metal layer. The MIM capacitor module includes a bottom electrode formed in the lower metal layer, an insulator cup formed in a tub opening in the dielectric region and including a laterally extending insulator cup base formed on the bottom electrode, a top electrode formed in an opening defined by the insulator cup, a vertically-extending bottom electrode contact formed in the dielectric region and contacting the bottom electrode, and a top electrode connection element and a bottom electrode connection element formed in the upper metal layer, wherein the top electrode connection element is electrically connected to the top electrode and the bottom electrode connection element is electrically connected to the vertically-extending bottom electrode contact.

In some examples, each of the lower metal layer and the upper metal layer comprise metal interconnect layers, and the vertically-extending metal element comprises an interconnect via.

In some examples, the lower metal layer comprises a silicided polysilicon layer, the lower metal element comprises a first metal silicide formed on a first polysilicon structure, and the bottom electrode comprises a second metal silicide formed on a second polysilicon structure.

In some examples, the vertically-extending bottom electrode contact of the MIM capacitor module and the vertically-extending metal element of the IC structure via are formed from a conformal metal.

In some examples, the lower metal layer is formed from a different metal than the conformal metal.

In some examples, the laterally extending insulator cup base is formed directly on the bottom electrode.

In some examples, the insulator cup includes a vertically-extending insulator cup sidewall extending upwardly from the laterally extending insulator cup base, wherein the vertically-extending insulator cup sidewall is formed on a vertically-extending surface of the dielectric region.

Another aspect provides a method including forming a lower metal layer including a bottom electrode; forming a dielectric region over the lower metal layer; patterning and etching the dielectric region to form a tub opening and a bottom electrode contact opening in the dielectric region; depositing a conformal metal over the dielectric region, the deposited conformal metal (a) filling the bottom electrode contact opening to form a bottom electrode contact structure and (b) partially filling the tub opening; performing a metal etch process that removes (a) portions of the conformal metal over the dielectric region and (b) the conformal metal in the tub opening; depositing an insulator layer over the dielectric region and forming an insulator cup structure in the tub opening, the insulator cup structure including a laterally extending insulator cup structure base formed on the bottom electrode and a vertically-extending insulator cup structure sidewall; depositing a top electrode metal over the insulator layer and extending into an opening defined by the insulator cup structure; performing a planarization process to remove (a) upper portions of the top electrode metal, (b) upper portions of the insulator layer, (c) a partial vertical thickness of the dielectric region, and (d) an upper portion of the bottom electrode contact structure in the bottom electrode contact opening; wherein after the planarization process, a remaining portion of the insulator layer defines an insulator cup, a remaining portion of the top electrode metal defines a top electrode, and a remaining portion of the vertically-extending bottom electrode contact structure defines a vertically-extending bottom electrode contact; and forming an upper metal layer including (a) a bottom electrode connection element electrically connected to the vertically-extending bottom electrode contact and (b) a top electrode connection element electrically connected to the top electrode.

In some examples, the metal etch process forms a recess in the upper portion of the bottom electrode contact structure that defines a recessed region of the bottom electrode contact structure, the recessed region of the bottom electrode contact structure has a vertical depth, and the planarization process extends vertically below the vertical depth of the recessed region of the bottom electrode contact structure.

In some examples, forming the dielectric region over the lower metal layer comprises forming the dielectric region including (a) a base component having a base component vertical thickness and (b) a sacrificial component over the base component and having a sacrificial component vertical thickness, and the planarization process removes the sacrificial component vertical thickness of the dielectric region.

In some examples, the deposited conformal metal forms a cup-shaped conformal metal structure in the tub opening.

In some examples, the lower metal layer and the upper metal layer respectively comprise metal interconnect layers.

In some examples, the lower metal layer comprises a silicided polysilicon layer, wherein the bottom electrode comprises a metal silicide formed on a polysilicon structure.

BRIEF DESCRIPTION OF THE DRAWINGS

Example aspects of the present disclosure are described below in conjunction with the figures, in which.

It should be understood the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

Figure 1A:
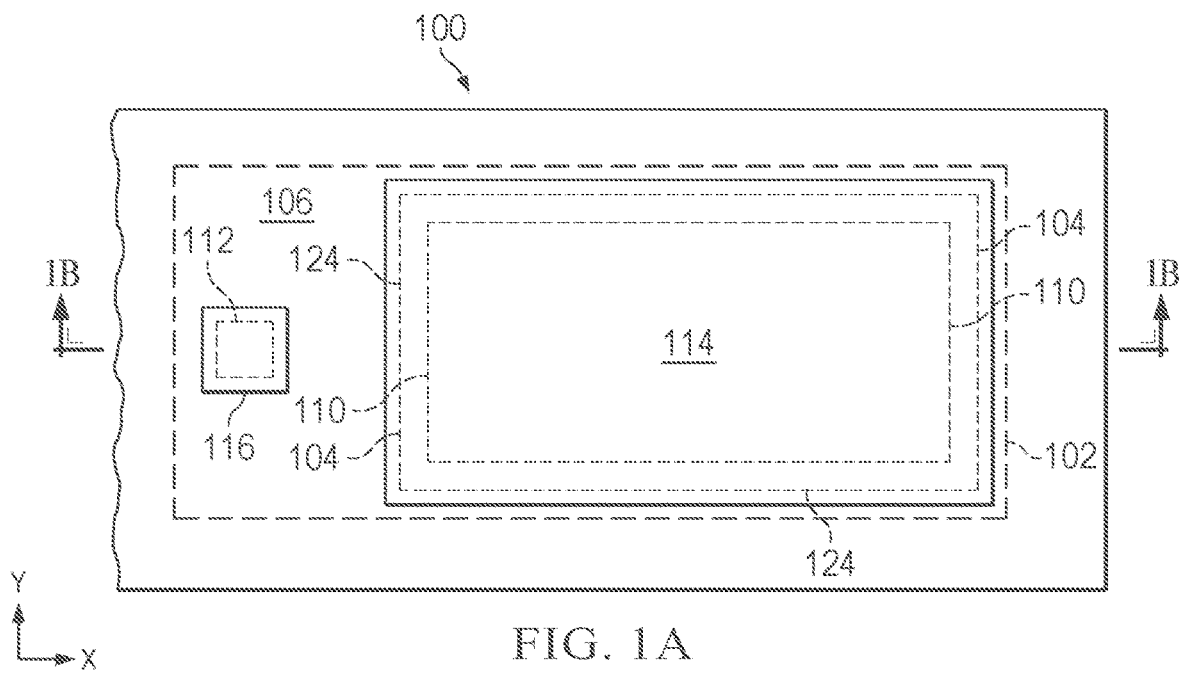
FIG. 1A is a top down view and FIG. 1B is a side cross-sectional view of an example MIM capacitor module.
Figure 1B:
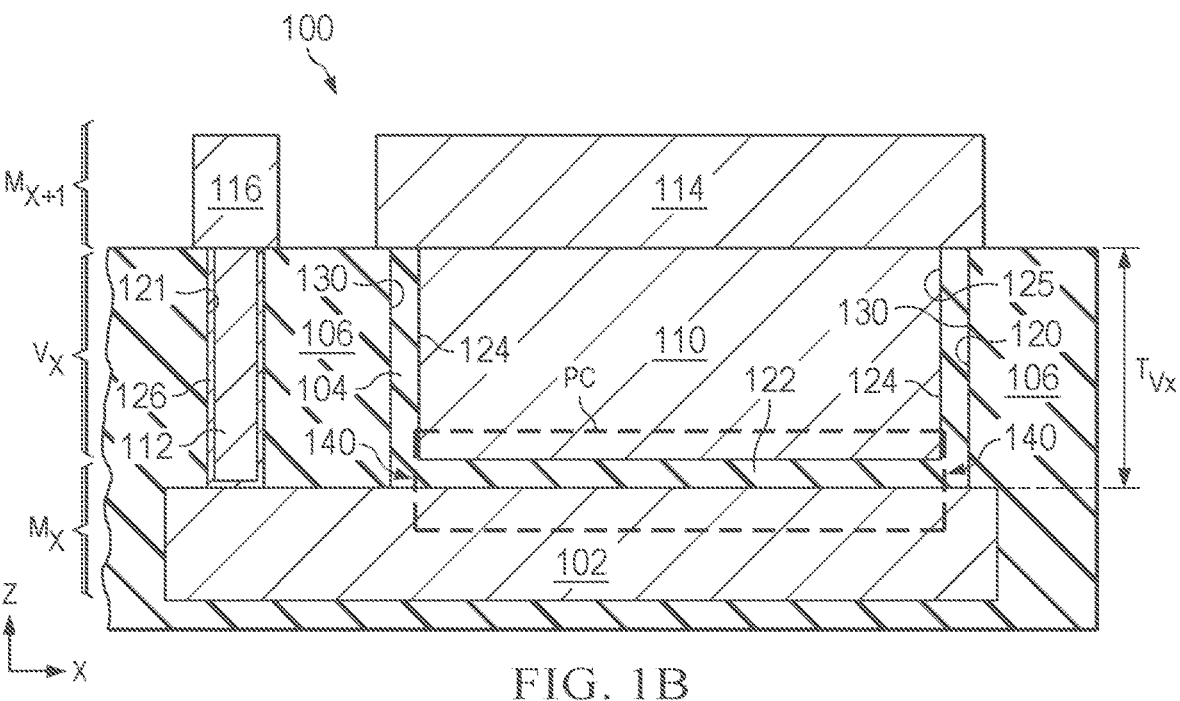

FIGS. 1A and 1B show an example MIM capacitor module 100 according to the present disclosure. In particular, FIG. 1A shows a top view of the MIM capacitor module 100, and FIG. 1B shows a side cross-sectional view of the MIM capacitor module 100 through cut line 1B-1B shown in FIG. 1A. As shown, the MIM capacitor module 100 includes (a) a bottom electrode 102, (b) an insulator cup 104 in a tub opening formed in a dielectric region 106, (c) a top electrode 110 formed in an opening defined by the insulator cup 104, and (e) a vertically-extending bottom electrode contact 112 formed in the dielectric region 106 and electrically contacting the bottom electrode 102, (f) a top electrode connection element 114 electrically connected to the top electrode 110, and (g) a bottom electrode connection element 116 electrically connected to the vertically-extending bottom electrode contact 112.

The bottom electrode 102 may be formed in a lower metal layer $M_x$, for example a lower metal interconnect layer (e.g., an aluminum interconnect layer) or a silicided polysilicon layer, as discussed below in more detail.

The insulator cup 104 is formed in a tub opening 120 formed in dielectric region 106, for example an Inter-Metal Dielectrics (IMD) region or a Poly-Metal Dielectrics (PMD)

region comprising one or more dielectric materials, e.g., silicon oxide, PSG (phosphosilicate glass), or FSG (fluorine doped glass), or a combination thereof. The insulator cup 104 includes (a) a laterally-extending insulator cup base 122 formed on the bottom electrode 102 and (b) an insulator cup sidewall 124 extending upwardly from the laterally-extending insulator cup base 122. In this example, the insulator cup sidewall 124 extends upwardly from a lateral perimeter edge of the laterally-extending insulator cup base 122. In some examples, the insulator cup 104 comprises silicon nitride (SiN), e.g., with a thickness in the range of 250-750 Å. Alternatively, insulator cup 104 may comprise $SiO_2$, $Al_2O_3$, $ZrO_2$, $HfO_2$, $ZrSiO_x$, $HfSiO_x$, HfAlOx, or $Ta_2O_5$, or other suitable capacitor insulator material.

In some examples, the vertically-extending insulator cup sidewall 124 has a closed-loop perimeter surrounded by the dielectric region 106 in the x-y plane, e.g., as shown in FIG. 1A. In some examples, the vertically-extending insulator cup sidewall 124 is formed directly on a vertically-extending surface 130 of the dielectric region 106 defined by the tub opening 120.

The top electrode 110 may fill an opening 125 defined by the insulator cup 104, and may comprise Al, Ti, TiN, W, or a combination thereof, for example a combination of TiN and Al, and may be deposited by a physical vapor deposition (PVD) process, for example.

The vertically-extending bottom electrode contact 112 is formed in a bottom electrode contact opening 121 formed in dielectric region 106 and extends vertically through the dielectric region 106 to electrically connect the bottom electrode connection element 116 to the bottom electrode 102. In some examples, the vertically-extending bottom electrode contact 112 is formed from tungsten (W) or other conformal metal. In some examples, the vertically-extending bottom electrode contact 112 is formed over a liner 126, e.g., comprising TiN. In addition, as discussed below with reference to FIG. 2 and FIGS. 3A-3J, in some examples the vertically-extending bottom electrode contact 112 is formed concurrently with at least one vertically-extending metal element of a separate IC structure, for example at least one interconnect via of a separate interconnect structure.

As shown, the insulator cup 104, top electrode 110, and vertically-extending bottom electrode contact 112 may be formed in a via layer $V_x$ between the lower metal layer $M_x$ and an upper metal layer $M_{x+1}$ (discussed below). The via layer $V_x$ has a vertical thickness $Tv_x$, for example, in the range of 5,000-8,000 Å.

The top electrode connection element 114 and the bottom electrode connection element 116 may be formed in the upper metal layer $M_{x+1}$, e.g., a metal interconnect layer (e.g., an aluminum interconnect layer) or a bond pad layer, formed over the via layer $V_x$. The top electrode connection element 114 and bottom electrode connection element 116 may have any suitable shapes and sizes. For example, the top electrode connection element 114 and bottom electrode connection element 116 may respectively have a square or rectangular shape in an x-y plane, e.g., as shown in FIG. 1A. In another example (not shown) the top electrode connection element 114 and bottom electrode connection element 116 may respectively have a generally circular shape in the x-y plane. As another example, the top electrode connection element 114 and/or bottom electrode connection element 116 may respectively be substantially elongated, e.g., extending further laterally across the wafer in a first one of the x-direction or the y-direction than the lateral extension across a second one of the x-direction or the y-direction. In some examples, the top electrode connection element 114 and/or bottom electrode connection element 116 may be omitted, and thus may be optional. For example, the bottom electrode connection element 116 may be omitted, wherein the bottom electrode 102 may be contacted from below or laterally from the side, instead of from above.

The top electrode 110 is capacitively coupled to the bottom electrode 102 through the laterally-extending insulator cup base 122. As discussed above, the vertically-extending insulator cup sidewall 124 may be surrounded by the dielectric region 106 in the x-y plane (e.g., as shown in FIG. 1A), which may substantially prevent capacitive coupling between the top electrode 110 and other conductive structures (e.g., the bottom electrode 102 and/or vertically-extending bottom electrode contact 112) through the vertically-extending insulator cup sidewall 124. As a result, the structure of the MIM capacitor module 100 effectively defines a planar capacitor between the top electrode 110 and bottom electrode 102 through the laterally-extending insulator cup base 122, generally indicated by the dashed line PC. This planar capacitor defined by the structure of MIM capacitor module 100 may be suitable or advantageous for particular applications, e.g., as compared with a 3D MIM capacitor in which the insulator cup is formed in a conductive cup that allows both vertical capacitive coupling through both the insulator cup base and lateral capacitive coupling through the insulator cup sidewall. For example, a planar capacitor defined by the structure of MIM capacitor module 100 may provide better matching for analog circuits (e.g., matching device characteristics such as resistance and capacitance), and/or higher breakdown voltage without suffering from an enhanced electric field in the corners.

The transition from the laterally-extending insulator cup base 122 to the vertically-extending insulator cup sidewall 124 defines an upwardly turning corner, indicated at 140, that wraps around the bottom corner of the top electrode 110, which may reduce an electric field associated with the top electrode and thereby improve the break-down voltage of the MIM capacitor module 100.

In some examples, e.g., as discussed below, the MIM capacitor module 100 is constructed using a damascene process that adds no additional photomask operations to a background integrated circuit fabrication process.

In some examples, both the top electrode 110 and bottom electrodes 102 are thick, e.g., having a vertical thickness of at least 2500 Å in the z-direction, thus providing low resistance. For example, with reference to FIG. 1B, in some examples the bottom electrode 102 is formed in a metal interconnect layer $M_x$, and thus has the vertical thickness of the metal interconnect layer, and the top electrode 110 is formed in a via layer $V_x$ (e.g., between two metal interconnect layers $M_x$ and $M_{x+1}$) and has the vertical thickness of the via layer $V_x$ less the small vertical thickness of the laterally-extending insulator cup base 122 (e.g., less 250-750A).

Figure 2:
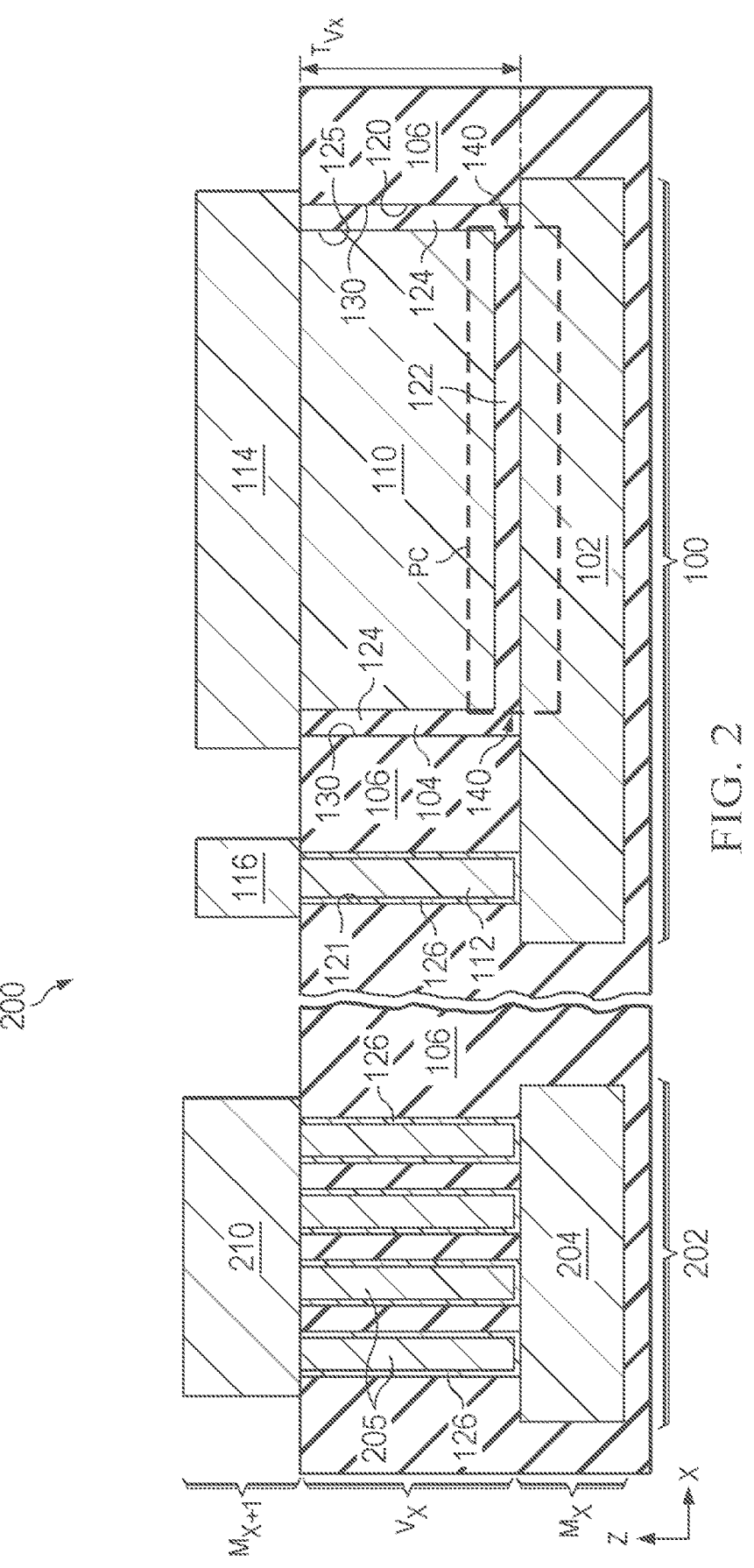
FIG. 2 is a side cross-sectional view showing an example IC structure including a MIM capacitor module and an interconnect structure, which may be formed concurrently, according to one example.

FIG. 2 is a side cross-sectional view showing an example IC device 200 including the MIM capacitor module 100 shown in FIGS. 1A-1B and a separate IC structure 202 formed concurrently, according to one example. As mentioned above, the MIM capacitor module 100 may be constructed without adding any photomask operations to the background integrated circuit fabrication process (e.g., the background integrated circuit fabrication process for forming the IC structure 202 and/or other IC elements).

As discussed above, MIM capacitor module 100 includes (a) bottom electrode 102 formed in lower metal layer $M_x$, (b) top electrode connection element 114 and bottom electrode connection element 116 formed in upper metal layer $M_{x+1}$, and (c) insulator cup 104, top electrode 110, and vertically-extending bottom electrode contact 112 formed in via layer $V_x$ between lower metal layer $M_x$ and upper metal layer $M_{x+1}$. Insulator cup 104 includes laterally-extending insulator cup base 122 and insulator cup sidewall 124 extending upwardly from the laterally-extending insulator cup base 122, and top electrode 110 formed in opening 124 defined by the insulator cup 104. Insulator cup 104 and vertically-extending bottom electrode contact 112 may be formed in respective openings in dielectric region 106. In some examples the vertically-extending insulator cup sidewall 124 of insulator cup 104 is formed directly on vertically-extending surface 130 of dielectric region 106 defined by tub opening 120.

As discussed above, the structure of the MIM capacitor module 100 effectively defines a planar capacitor between the top electrode 110 and bottom electrode 102 through the laterally-extending insulator cup base 122, generally indicated by the dashed line PC.

As shown in FIG. 2, the IC structure 202 may include a lower metal element 204 formed in a lower metal layer $M_x$ and an upper metal element 210 formed in an upper metal layer $M_{x+1}$ and electrically connected to the lower metal element 204 by vertically-extending metal elements 205 formed in via layer $V_x$, which vertically-extending metal elements 205 may be formed by depositing a conformal via material, e.g., tungsten, into respective via openings. In some examples, vertically-extending metal elements 205 are formed over liner 126, e.g., comprising TiN.

As used herein, a "metal layer," for example in the context of lower metal layer $M_x$ and upper metal layer $M_{x+1}$, may comprise any metal or metalized layer or layers, including (a) a metal interconnect layer, e.g., comprising copper, aluminum or other metal deposited by a subtractive patterning process (e.g., deposition, patterning, and etching of a metal layer) or formed by a damascene process, or (b) a silicided polysilicon layer including a number of polysilicon regions each having a layer or region of metal silicide formed thereon, for example. For example, in some examples the lower metal layer $M_x$ may be a silicided polysilicon layer and the upper metal layer $M_{x+1}$ may comprise a first metal interconnect layer, often referred to as metal-1. In such examples, x=0 such that the lower metal layer $M_x=M_0$ and the upper metal layer $M_{x+1}=M_1$ (i.e., metal-1). Further, as used herein, an "interconnect structure," e.g., in the context of the IC structure 202 discussed below, may include any type or types of metal layers as defined above.

In some examples, e.g., as discussed below with reference to FIGS. 3A-3J, IC structure 202 may comprise an interconnect structure, wherein (a) lower metal layer $M_x$ comprises a lower interconnect metal layer and lower metal element 204 comprises a lower interconnect element formed in the lower interconnect metal layer, (b) upper metal layer $M_{x+1}$ comprises an upper interconnect metal layer and upper metal element 210 comprises an upper interconnect element formed in the upper interconnect metal layer, and (c) vertically-extending metal elements 205 comprise interconnect vias formed in via layer $V_x$ and electrically connected between the lower interconnect element and upper interconnect element.

In other examples, e.g., as discussed below with reference to FIG. 4, lower metal layer $M_x$ comprises a silicided polysilicon layer, upper metal layer $M_{x+1}$ comprises a first metal interconnect layer (metal-1 interconnect layer), and via layer $V_x$ comprises a PMD region below the metal-1 interconnect layer. In such examples, (a) lower metal element 204 and bottom electrode 102 formed in the silicided polysilicon layer comprise a respective metal silicide formed on a respective polysilicon region, (b) upper metal element 210, top electrode connection element 114 and bottom electrode connection element 116 comprise metal elements formed in the metal-1 interconnect layer, and (c) vertically-extending metal elements 205 comprise contacts electrically connected between the metal silicide of the lower metal element 204 and the upper metal element 210.

In some examples, the lower metal element 204 and upper metal element 210 may comprise respective wires or other laterally elongated structures, or discrete pads (e.g., having a square or substantially square shape from a top view), or any other suitable shapes and structures.

The lower metal element 204 and bottom electrode 102 may be formed concurrently in lower metal layer $M_x$, e.g., as discussed below with reference to FIG. 3A. The upper metal element 210, top electrode connection element 114, and bottom electrode connection element 116 may be formed concurrently in upper metal layer $M_{x+1}$, e.g., as discussed below with reference to FIGS. 3I and 3J. The vertically-extending metal elements 205, insulator cup 104, top electrode 110, and vertically-extending bottom electrode contact 112 may be formed in via layer $V_x$ between lower metal layer $M_x$ and upper metal layer $M_{x+1}$, e.g., using a damascene process as discussed below with respect to FIGS. 3A-3H. In some examples vertically-extending metal elements 205 and vertically-extending bottom electrode contact 112 may be formed concurrently, e.g., by depositing tungsten or other conformal metal in respective openings in dielectric region 106, e.g., as discussed below with reference to FIGS. 3B-3C.

FIGS. 3A-3J show an example method of forming the example IC device 200 shown in FIG. 2, including MIM capacitor module 100 and IC structure 202. As noted above, in other examples, the IC structure 202 may be optional, such that MIM capacitor module 100 may be formed by the process described below without the elements of IC structure 202.

Figure 3A:
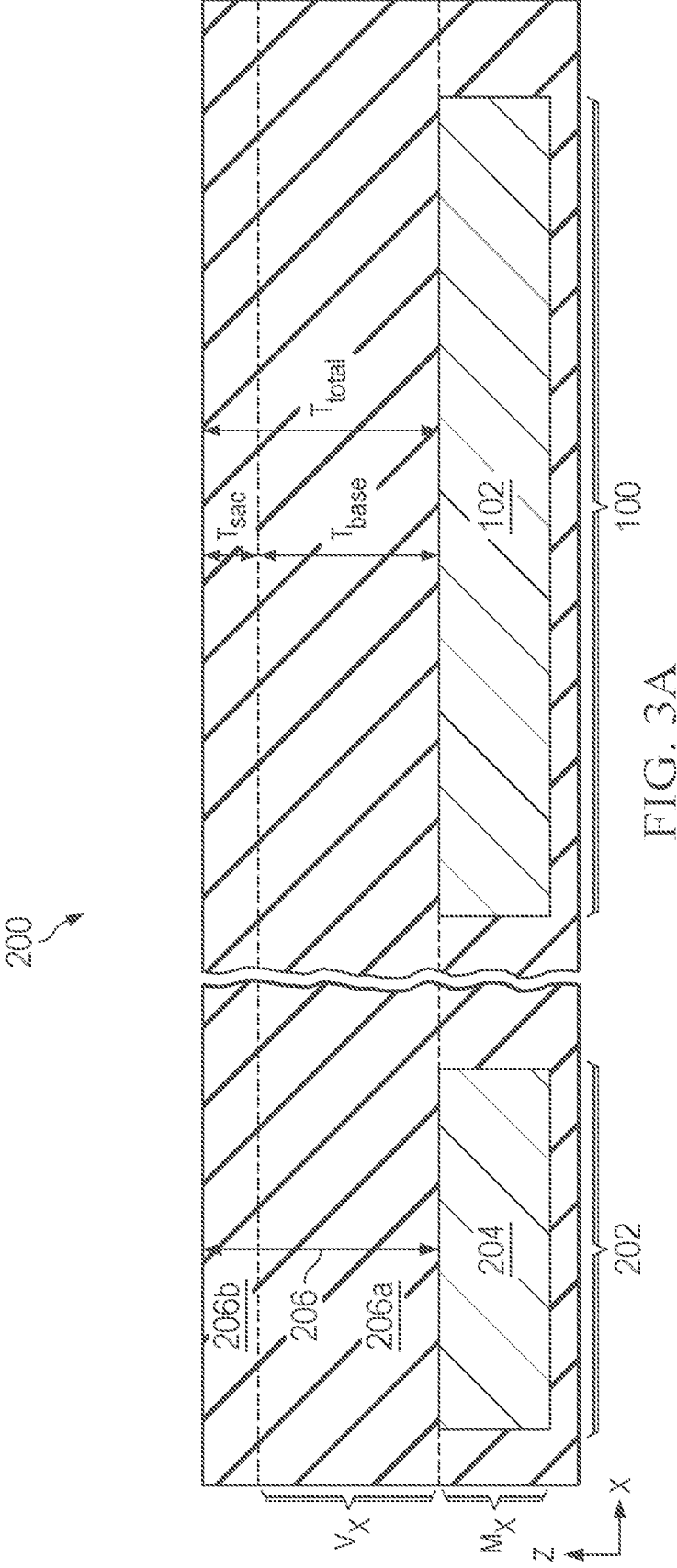
FIGS. 3A-3J show an example method of forming the example IC structure shown in FIG. 2, including a MIM capacitor module and interconnect structure.

As shown in FIG. 3A, the lower metal element 204 and the bottom electrode 102 are formed in the lower metal layer $M_x$. In this example, the lower metal layer $M_x$ may comprise a metal interconnect layer, wherein the lower metal element 204 and bottom electrode 102 are respectively formed as metal elements (e.g., aluminum interconnect elements). In another example, e.g., as shown in FIG. 4 discussed below, the lower metal layer $M_x$ may comprise a silicided polysilicon layer, wherein the lower metal element 204 and bottom electrode 102 respectively comprise a metal silicide formed on a respective polysilicon structure.

A dielectric region 206 (e.g., an Inter Metal Dielectrics (IMD) region or Poly Metal Dielectrics (PMD) region) is formed over the lower metal element 204 and bottom electrode 102 formed in lower metal layer $M_x$. As shown, dielectric region 206 may be deposited and planarized with a total thickness $T_{total}$ including (a) a base dielectric component 206a having a base component vertical thickness $T_{base}$ and (b) a sacrificial dielectric component 206b over the base component 206a, the sacrificial dielectric component 206b having a sacrificial component vertical thickness $T_{sac}$. Base dielectric component 206a and sacrificial dielectric component 206b may comprise the same dielectric material, e.g., deposited in a single process. Alternatively, dielectric component 206a and sacrificial dielectric component 206b may comprise different dielectric materials, deposited by respective deposition processes. Base dielectric component 206a and sacrificial dielectric component 206b may respectively comprise any suitable dielectric material or materials, for example, silicon oxide, PSG (phosphosilicate glass), FSG (fluorine doped glass), or a combination thereof, and may be respectively deposited by a Plasma Enhanced Chemical Vapor Deposition (PECVD) process, High Density Plasma (HDP) deposition process, or other suitable deposition process or processes.

As discussed below, the sacrificial dielectric component 206b may be subsequently removed (e.g., by a CMP process), leaving the base dielectric component 206a that defines the dielectric region 106 of the completed MIM module 100 shown in FIG. 2. Thus, the vertical thickness $T_{base}$ of the base dielectric component 206a may be equal to or marginally greater than (e.g., up to 10%% greater than) the vertical thickness $Tv_x$ of the via layer $V_x$, which may be defined by Process of Record (POR) or baseline specifications for the IC device 200. For example, the vertical thickness $T_{base}$ of the base dielectric component 206a may be in the range of 5,000-8,000 Å.

As discussed below, e.g., with reference to FIGS. 3D-3H, the sacrificial dielectric component 206b may be provided to allow a removal of recessed regions 330 of a bottom electrode contact structure 314 and vertically-extending metal element structures 312 formed in the dielectric region 206, to thereby form the vertically-extending bottom electrode contact 112 and vertically-extending metal elements 205 having planar, non-recessed upper surfaces coplanar with an upper surface of the resulting dielectric region 106, e.g., as shown in FIG. 2. Thus, the sacrificial component vertical thickness $T_{sac}$ of the sacrificial dielectric component 206b may be greater than a vertical depth of a deepest recessed region 330. In some examples, the sacrificial component vertical thickness $T_{sac}$ may be in the range of 500-1,000 Å.

Figure 3B:
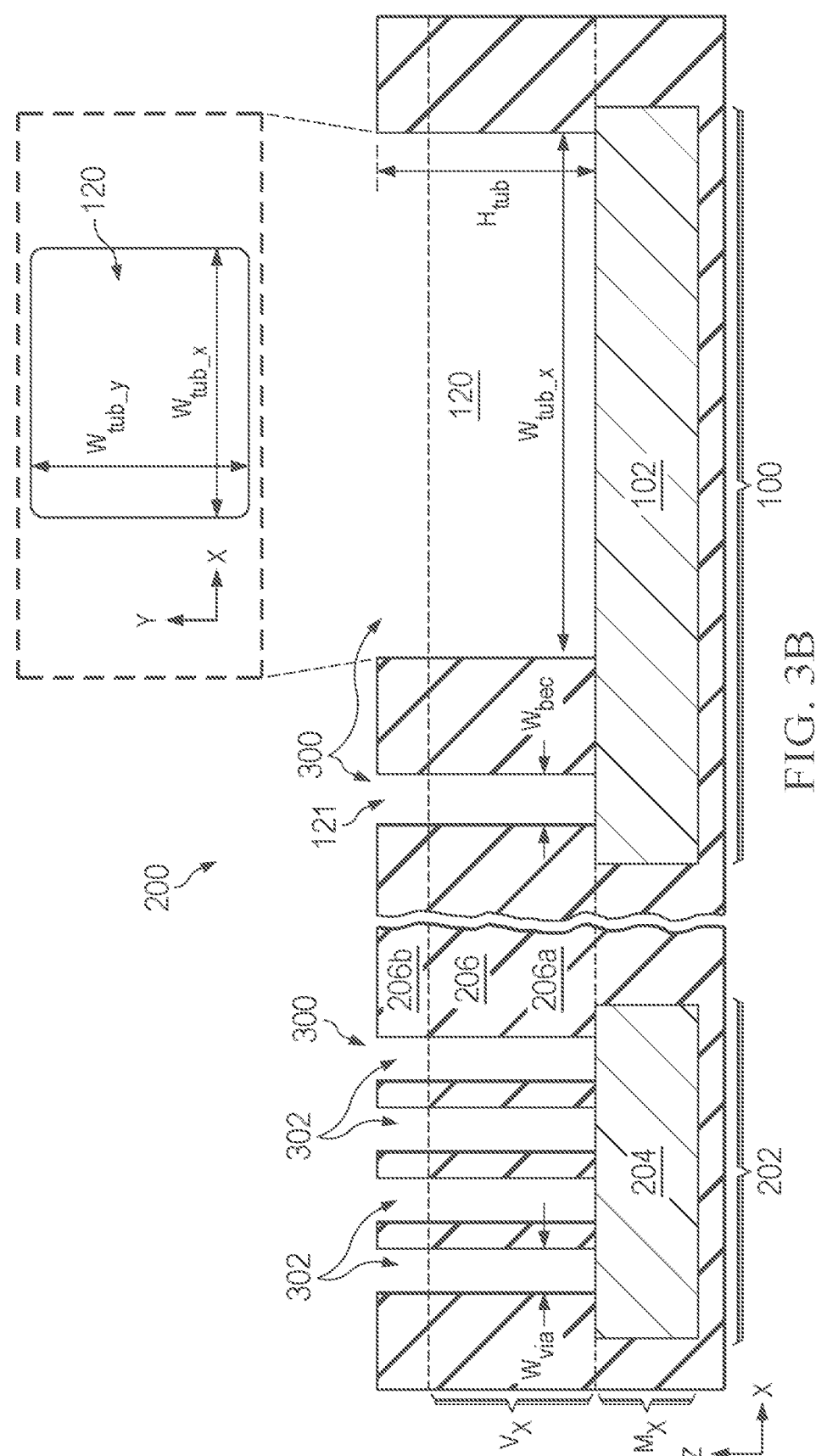

As shown in FIG. 3B, dielectric region openings 300, including vertically-extending metal element openings 302, the tub opening 120, and the bottom electrode contact opening 121, may be patterned (using a photomask) and etched in the dielectric region 206, i.e., in the base dielectric component 206a and the sacrificial dielectric component 206b. Dielectric region openings 300 may be formed by masking with photoresist material and using a plasma etch or other suitable etch, followed by a resist strip or other suitable process to remove remaining portions of photoresist material. The etch process to form dielectric region openings 300 may be a selective etch that stops on lower metal element 204 and bottom electrode 102 (e.g., comprising aluminum or other metal).

In some examples, vertically-extending metal element openings 302 may be via openings having a width (or diameter or Critical Dimension (CD)) $W_{via}$ in both the x-direction and y-direction in the range of 0.1-0.5 μm, for example. Bottom electrode contact opening 121 may also be a via opening, e.g., having a width $W_{bec}$ in both the x-direction and y-direction in the range of 0.1-0.5 μm, for example. In other examples, the width $W_{bec}$ of bottom electrode contact opening 121 may have other suitable dimensions.

In contrast, tub opening 120 may have a substantially larger width in the x-direction ($W_{tub\_x}$) and/or y-direction ($W_{tub\_y}$) than vertically-extending metal element openings 302 and bottom electrode contact opening 121. The shape and dimensions of the tub opening 120 may be selected based on various parameters, e.g., for effective manufacturing of the MIM capacitor module 100 (e.g., effective formation of the insulator cup 104 and top electrode 110 in the tub opening 120) and/or for desired performance characteristics of the resulting MIM capacitor module 100. In one example, e.g., as shown in FIG. 3B, the tub opening 120 may have a square or rectangular shape from the top view. In other examples, tub opening 120 may have a circular or oval shape from the top view.

As noted above, a width of tub opening 120 in the x-direction ($W_{tub\_x}$), y-direction ($W_{tub\_y}$), or both the x-direction and y-direction ($W_{tub\_x}$ and $W_{tub\_y}$) may be substantially larger than the width $W_{Via}$ of vertically-extending metal element openings 302 in the x-direction, y-direction, or both the x-direction and y-direction. For example, in some examples, width $W_{tub\_x}$ and $W_{tub\_y}$ of tub opening 120 are respectively at least twice as large as the width $W_{via}$ of vertically-extending metal element openings 302. In particular examples, width $W_{tub\_x}$ and $W_{tub\_y}$ of tub opening 120 are respectively at least five time as large or at least 10 times as large as the width $W_{via}$ of vertically-extending metal element openings 302. In some examples, $W_{tub\_x}$ and $W_{tub\_y}$ are respectively in the range of 1-100 μm.

Further, tub opening 120 may be formed with a height-to-width aspect ratio of less than or equal to 1.0 in both the x-direction and y-direction, e.g., to allow effective filling of the tub opening 120 by respective materials. For example, tub opening 120 may be formed with aspect ratios $H_{tub}/W_{tub\_x}$ and $H_{tub}/W_{tub\_y}$ respectively in the range of 0.01-1.0, for example in the range of 0.1-1.0. In some examples, aspect ratios $H_{tub}/W_{tub\_x}$ and $H_{tub}/W_{tub\_y}$ are respectively less than or equal to 1.0, e.g., for effective filling of tub opening 120 by respective materials to form insulator cup 104 and top electrode 110 in the tub opening 120. For example, tub opening 120 may be formed with aspect ratios $H_{tub}/W_{tub\_x}$ and $H_{tub}/W_{tub\_y}$ respectively in the range of 0.1-1.0, or more particularly in the range of 0.5-1.0.

Figure 3C:
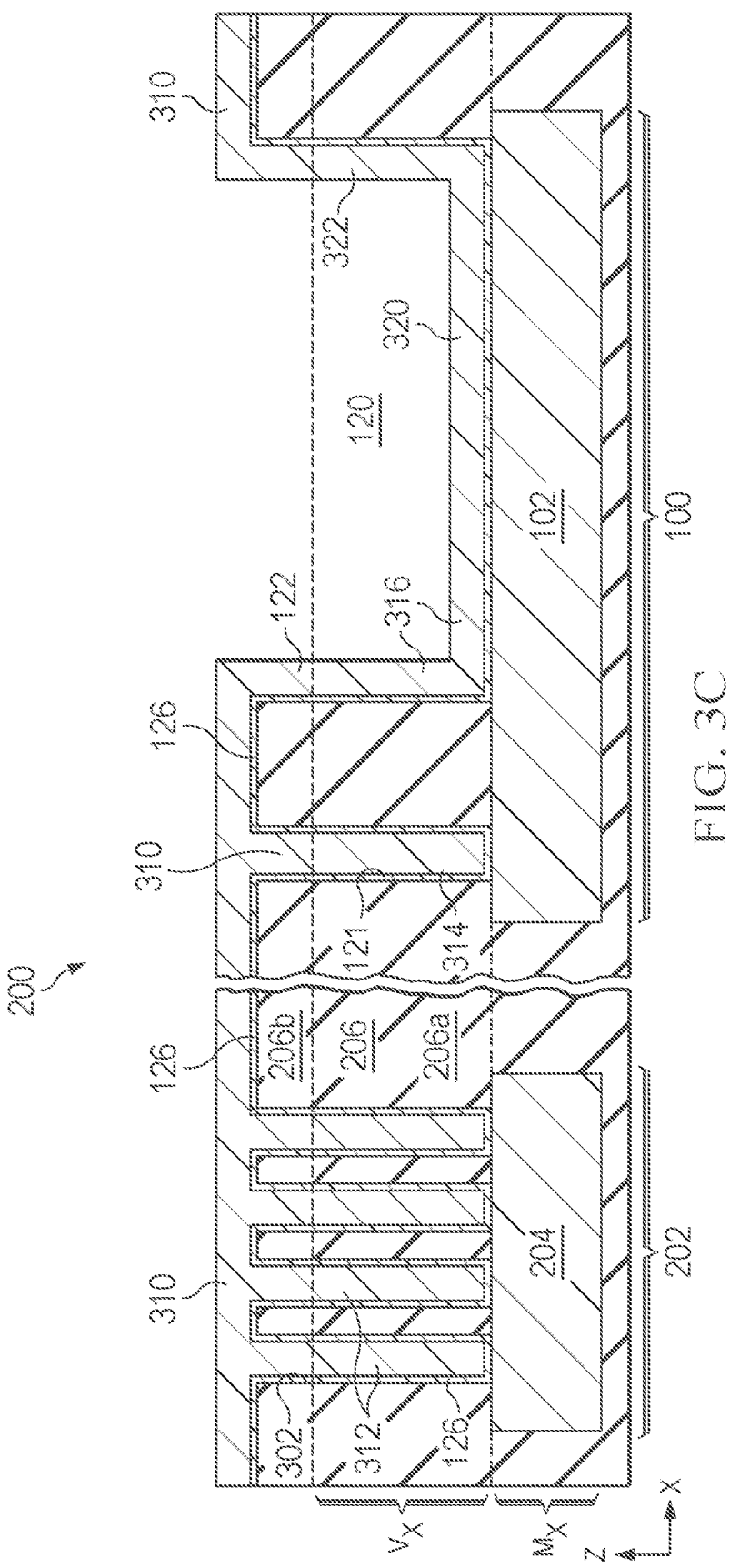

As shown in FIG. 3C, a liner (or "glue layer") 126, e.g., comprising TiN with a thickness which may be in the range of 50 Å-200 Å, is deposited over the structure and extends into respective dielectric region openings 300. A conformal metal 310 is deposited over the liner 126 and extends into respective via layer openings 300 to (a) fill vertically-extending metal element openings 302 to form respective vertically-extending metal element structures 312, (b) fill bottom electrode contact opening 121 to form bottom electrode contact structure 314, and (c) form a bottom electrode cup structure 316 in the tub opening 120, wherein the bottom electrode cup structure 316 includes a laterally-extending bottom electrode cup base 320 and a bottom electrode cup sidewall 322 extending upwardly (in the z-direction) from a lateral perimeter edge of the laterally-extending bottom electrode cup base 320. In one example, the conformal metal 310 comprises tungsten deposited with a thickness in the range of 1000 Å-5000 Å. In other examples, the conformal metal 310 may comprise Co, TiN, or other conformal metal. The conformal metal 310 may be deposited by a conformal chemical vapor deposition (CVD) process or other suitable deposition process.

Figure 3D:
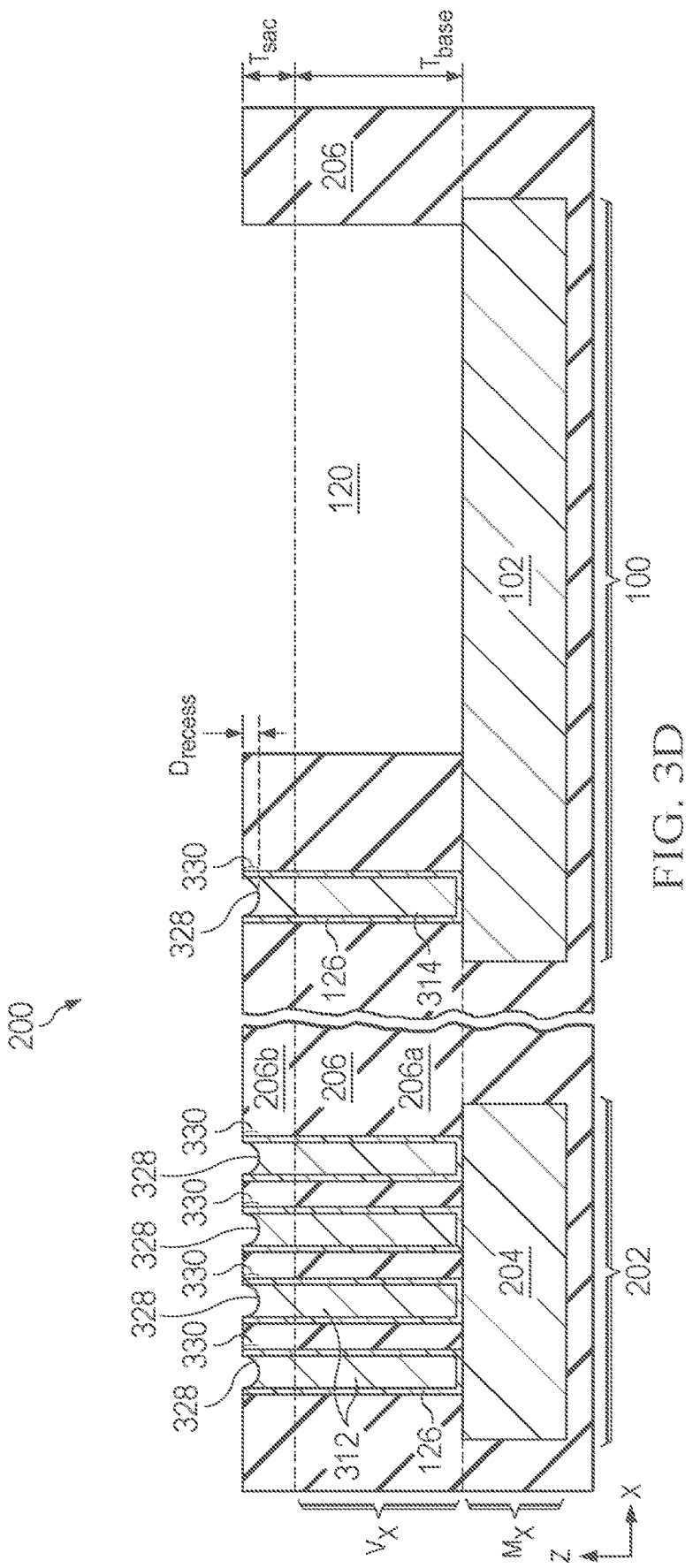

As shown in FIG. 3D, a metal etch is performed to remove portions of the conformal metal 310. For example, a metal etch (e.g., an isotropic wet etch or isotropic dry (plasma) etch) may be performed to (a) remove upper portions of the conformal metal 310 over the dielectric region 206, and (b) remove the bottom electrode cup structure 316 from the tub opening 120. The depth of the metal etch for fully removing the bottom electrode cup structure 316 from the tub opening 120 may result in an "over-etch" at the top of the structure that forms a respective recess 328 (e.g., a "plug recess") in respective upper portions of the bottom electrode contact structure 314 and respective vertically-extending metal element structures 312 that defines a respective recessed region 330 of the bottom electrode contact structure 314 and respective vertically-extending metal element structures 312. Each recess 328 has a respective vertical depth $D_{recess}$, wherein the sacrificial dielectric component 206b over the base component 206a is greater than the vertical depth $D_{recess}$ of the deepest recess 328.

The recessed regions 330 of bottom electrode contact structure 314 and vertically-extending metal element structures 312 have a non-planar upper surface that may be unsuitable for forming effective or reliable electrical contacts with overlying conductive elements, for example subsequently-formed bottom electrode connection element 116 and upper metal element 210, discussed below. Thus, as discussed below with respect to FIGS. 3G and 3H, the recessed regions 330 of bottom electrode contact structure 314 and vertically-extending metal element structures 312 may be removed by a planarization process that removes at least the sacrificial dielectric component 206b of dielectric region 206.

Figure 3E:
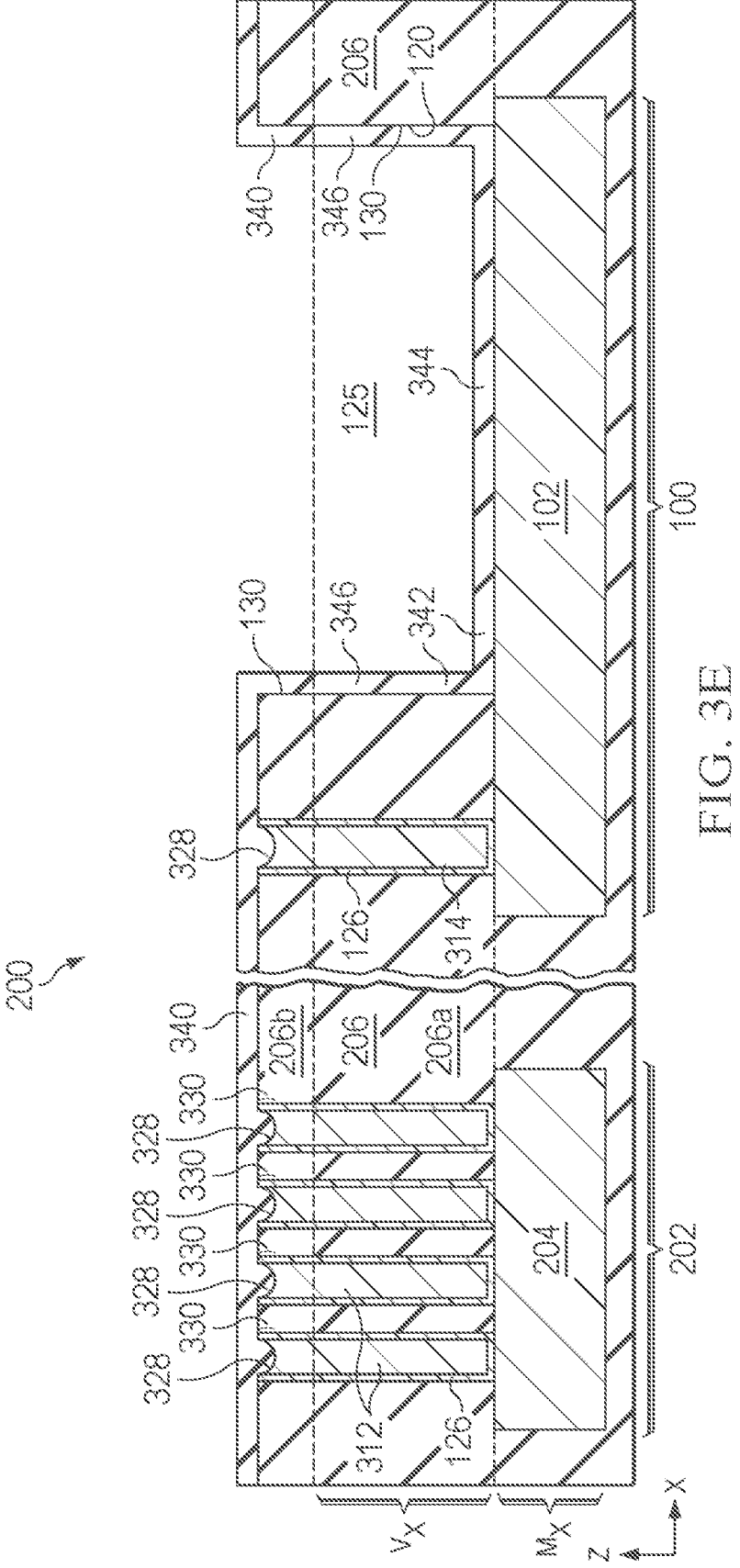

As shown in FIG. 3E, an insulator layer 340 is deposited over the structure and extends down into tub opening 120 to form an insulator cup structure 342 including a laterally-extending insulator cup structure base 344 formed on bottom electrode 102 and a vertically-extending insulator cup structure sidewall 346 extending upwardly from the laterally-extending insulator cup structure base 344. The insulator cup structure 342 defines opening 125 in which top electrode 110 is formed, as discussed below. In the illustrated example, the vertically-extending insulator cup structure sidewall 346 extends upwardly from a lateral perimeter edge of the laterally extending insulator cup structure base 344. In the illustrated example, the vertically-extending insulator cup structure sidewall 346 is formed directly on vertically-extending surface 130 of dielectric region 206 defined by tub opening 120.

In some examples, insulator layer 340 comprises silicon nitride (SiN) deposited with a thickness in the range of 250 Å-750 Å by a Plasma Enhanced Chemical Vapor Deposition (PECVD) process. Alternatively, insulator layer 340 may comprise $Al_2O_3$, $ZrO_2$, $HfO_2$, $ZrSiO_x$, $HfSiO_x$, HfAlOx, or $Ta_2O_5$, or other suitable capacitor insulator material deposited using an Atomic Layer Deposition (ALD) process.

Figure 3F:
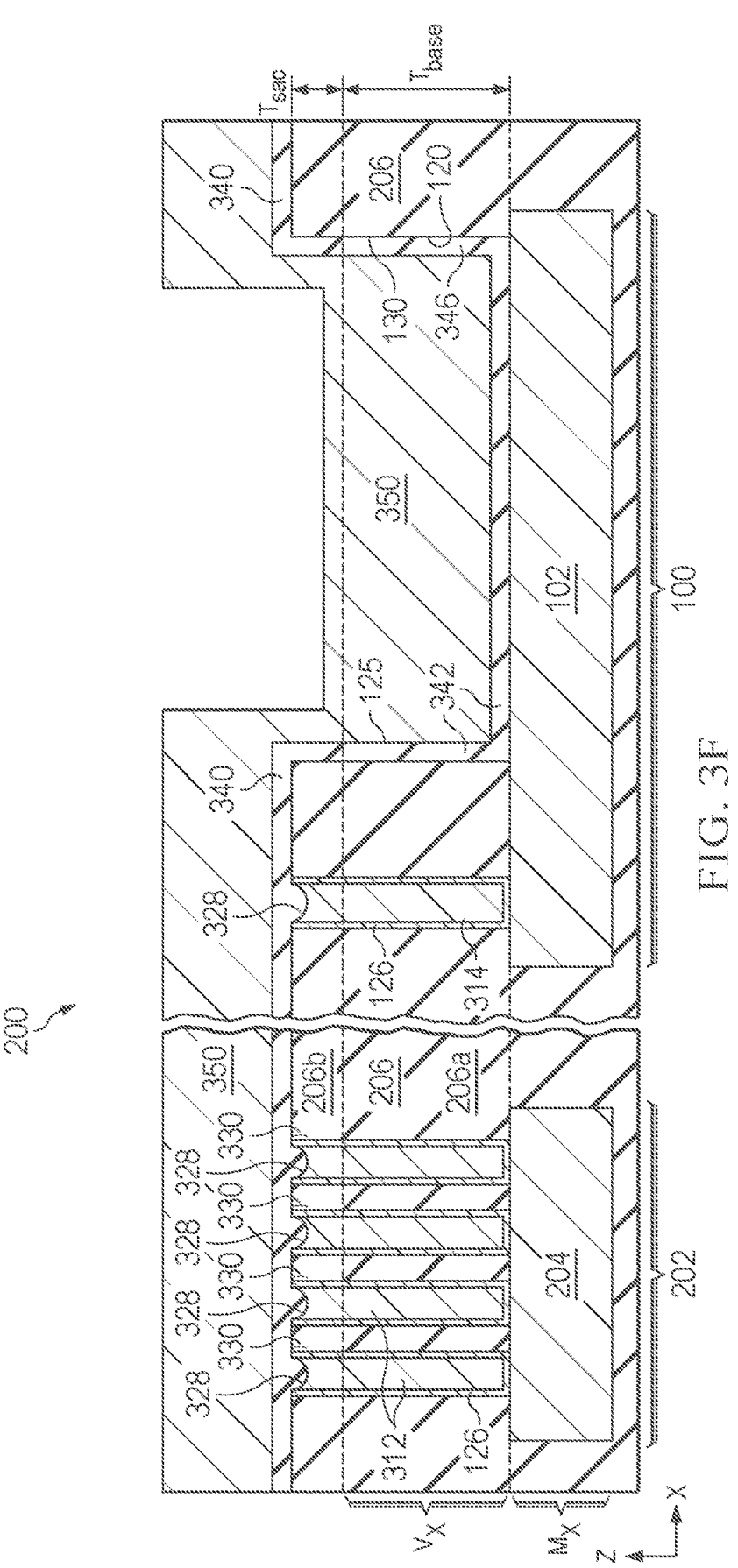

As shown in FIG. 3F, a top electrode metal 350 is deposited over the insulator layer 340 and extends into and fills opening 125 defined by the insulator cup structure 342. In some examples, top electrode layer 340 may comprise Al, Ti, TiN, W, or a combination thereof, for example TiN and Al, and may be deposited by a physical vapor deposition (PVD) process.

Figures 3G, 3H:
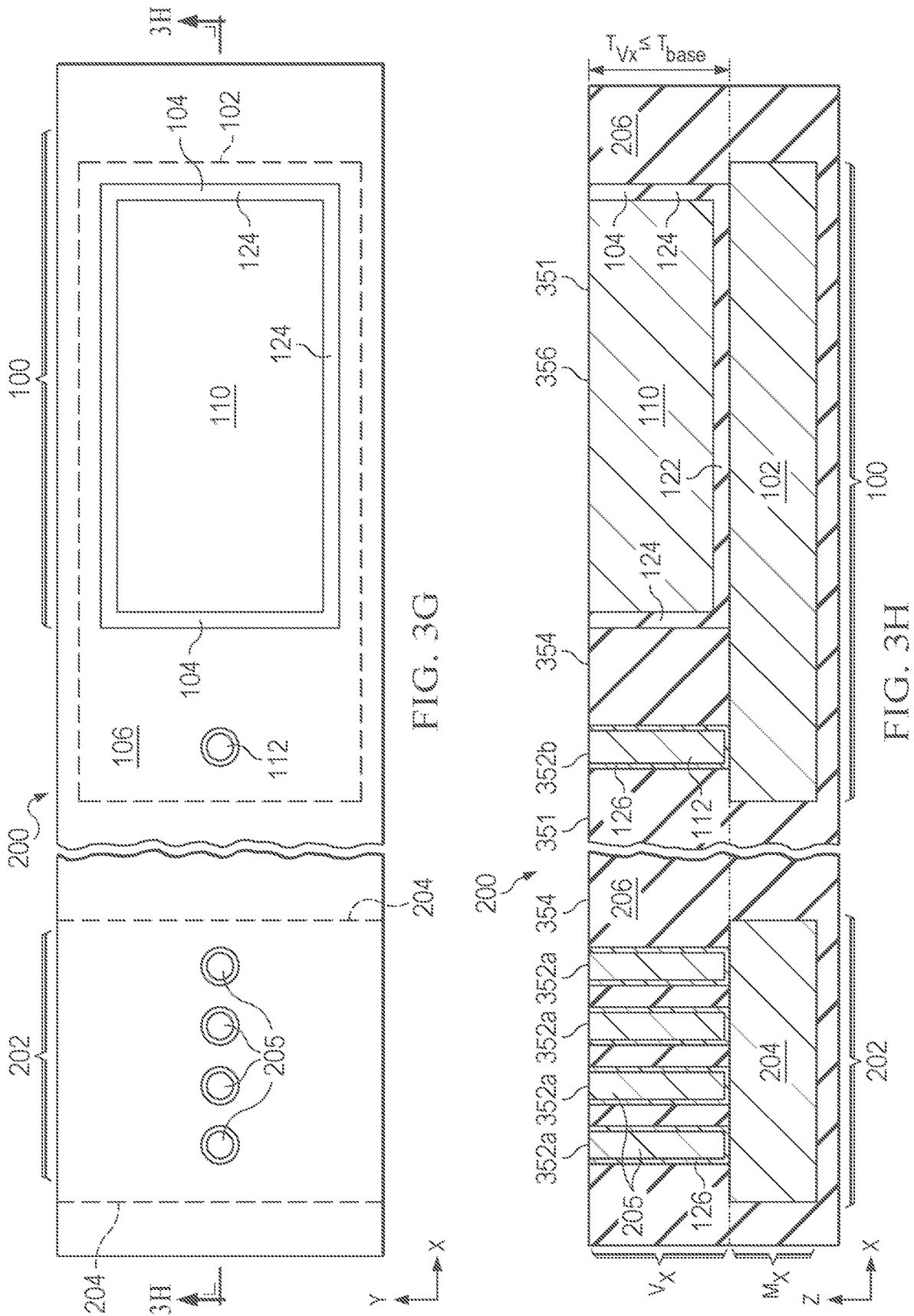

As shown in FIG. 3G (top view) and FIG. 3H (cross-sectional side view through line 3H-3H shown in FIG. 3G), a planarization process is performed to remove (a) upper portions of top electrode metal 350 to define top electrode 110, (b) upper portions of insulator layer 340 to define insulator cup 104, (c) a partial upper thickness of dielectric region 206, e.g., sacrificial dielectric component 206b, to define dielectric region 106, and (d) respective upper portions of the bottom electrode contact structure 314 and vertically-extending metal element structures 312, to define the bottom electrode contact 112 and vertically-extending metal elements 205. In some examples the planarization process comprises a chemical mechanical planarization (CMP) process.

As discussed below, the planarization process defines a planarized upper surface 351 of via layer $V_x$, including (a) planar, non-recessed upper surfaces 352a and 352b of vertically-extending bottom electrode contact 112 and respective vertically-extending metal elements 205, (b) a planar upper surface 354 of the planarized dielectric region 106, and (c) a planar upper surface 356 of top electrode 110.

A vertical depth (in the z-direction) of the planarization process may remove the recessed regions 330 of bottom electrode contact structure 314 and vertically-extending metal element structures 312. Thus, the planarization process may extend to a depth below the vertical depth $D_{recess}$ of the deepest recess 328.

The vertical depth of the planarization process may remove at least the sacrificial dielectric component 206b (i.e., the full sacrificial component vertical thickness $T_{sac}$) and optionally a partial upper thickness of the base dielectric component 206a (i.e., a partial thickness of the base component vertical thickness $T_{base}$). For example, where the dielectric component 206b is formed in a single deposition process (i.e., where base dielectric component 206a and sacrificial dielectric component 206b comprise the same dielectric material), the planarization process removes the sacrificial dielectric component 206b, leaving the base dielectric component 206a. As another example, where the dielectric component 206b is formed by multiple deposition processes (e.g., by depositing a first dielectric material defining base dielectric component 206a and subsequently depositing a different second dielectric material defining sacrificial dielectric component 206b), the planarization process may remove the sacrificial dielectric component 206b and a partial portion of the base component vertical thickness $T_{base}$ of the underlying base dielectric component 206a.

The remaining thickness of the planarized dielectric region 206 defines dielectric region 106 of MIM capacitor module 100, having a vertical thickness $Tv_x$ equal to or less than the base component vertical thickness $T_{base}$ (e.g., depending on whether a partial upper portion of the portion of the base component vertical thickness $T_{base}$ is removed by the planarization process).

Remaining portions of the insulator layer 340 define insulator cup 104 including the laterally extending insulator cup base 122 on bottom electrode 102 and vertically-extending insulator cup sidewall 124 extending upwardly from the laterally extending insulator cup base 122. The vertically-extending insulator cup sidewall 124 comprises a remaining portion of the vertically-extending insulator cup structure sidewall 346 after the planarization process.

A remaining portion of the top electrode metal 350 defines the top electrode 110 in the insulator cup 104, the top electrode 110 having the planar upper surface 356.

As shown in FIG. 3G, in a horizontal plane (x-y plane) the vertically-extending insulator cup sidewall 124 may have a closed-loop rectangular perimeter surrounding the top electrode 110, and surrounded by dielectric region 106. As shown, vertically-extending bottom electrode contact 112 and respective vertically-extending metal elements 205 may have a circular shape in the x-y plane. In other examples, vertically-extending bottom electrode contact 112 and/or respective vertically-extending metal elements 205 may have any other shape in the x-y plane, e.g., a square or rectangular shape.

Figure 3I:
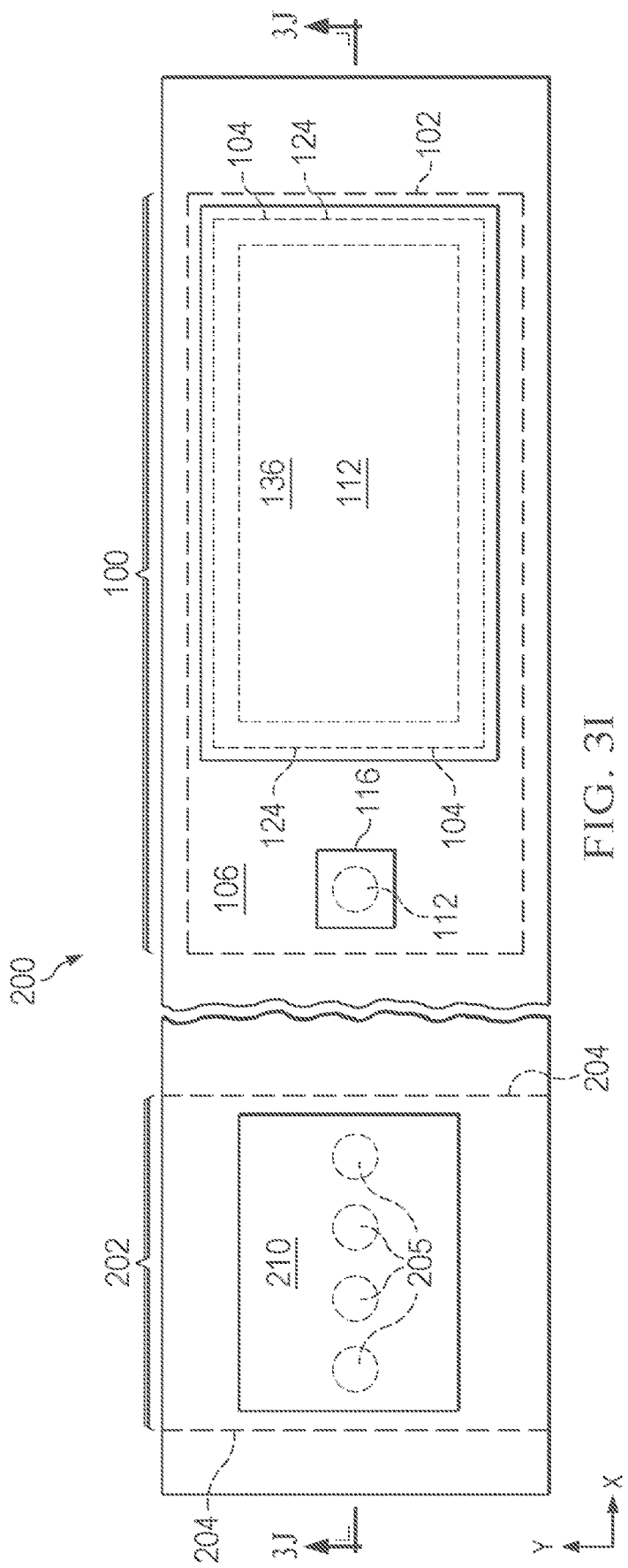
Figure 3J:
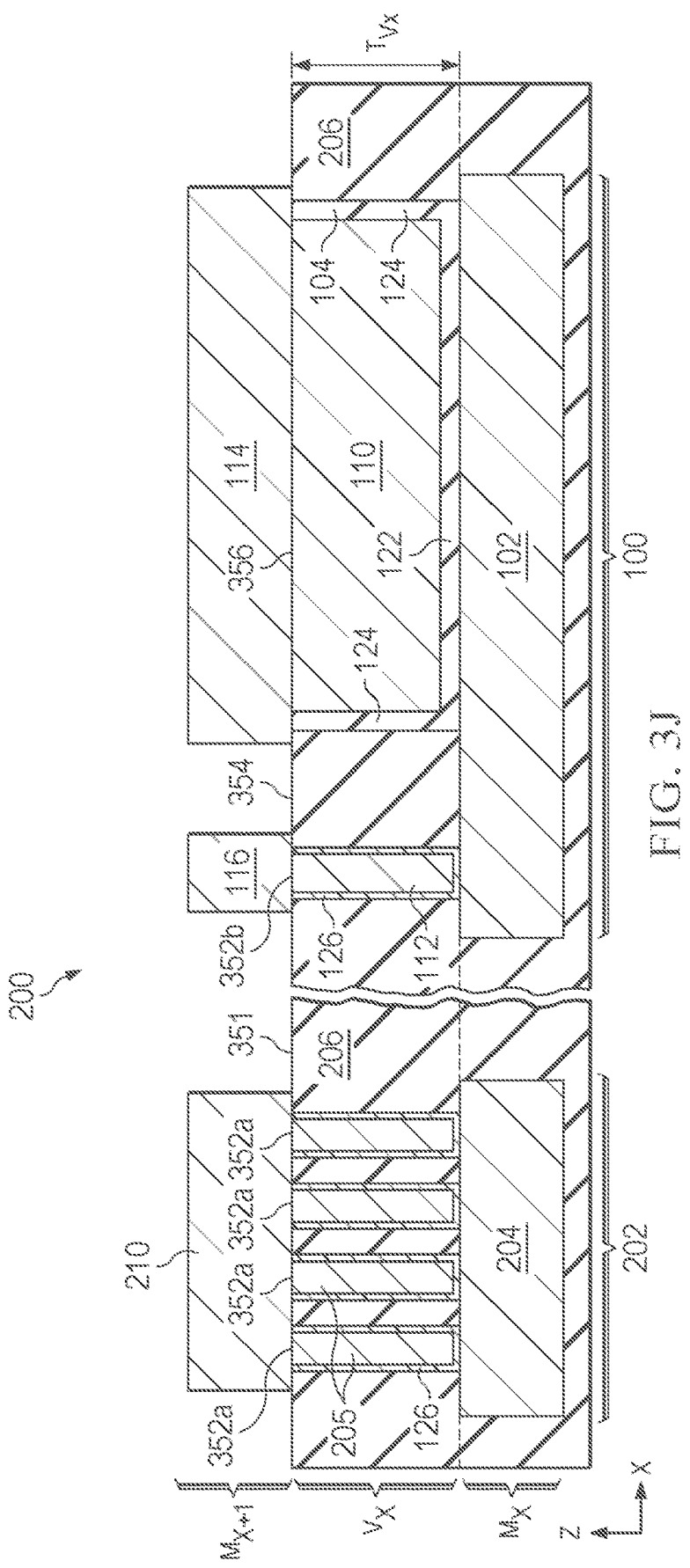

Next, as shown in FIGS. 3I and 3J, an upper metal layer ($M_{x+1}$ layer) may be formed on the planarized upper surface 351 of the via layer $V_x$. FIG. 3I shows a top view of the resulting structure after formation of the upper metal layer $M_{x+1}$, and FIG. 3J shows a side cross-sectional view taking through line 3J-3J shown in FIG. 3I. Various metal elements are formed in the upper metal layer $M_{x+1}$ (e.g., by a metal deposition, pattern, and etch process) including (a) the upper metal element 210 electrically connected to interconnect vias 206, (b) the top electrode connection element 114 electrically connected to top electrode 110, and (c) the bottom electrode connection element 116 electrically connected to the vertically-extending bottom electrode contact 112. The upper metal layer $M_{x+1}$ may comprise aluminum or other suitable metal.

As shown, upper metal element 210 may be formed directly on the planar top surfaces 352a of respective vertically-extending metal elements 205, the top electrode connection element 114 may be formed directly on the planar top surface 356 of top electrode 110, and the bottom electrode connection element 116 may be formed directly on the planar top surface 352b of the vertically-extending bottom electrode contact 112. Thus, the upper metal element 210 may be mechanically and electrically connected to the interconnect vias 205, (b) the top electrode connection element 114 may be mechanically and electrically connected to the top electrode 110, and (c) the bottom electrode connection element 116 may be mechanically and electrically connected to the vertically-extending bottom electrode contact 112

Figure 4:
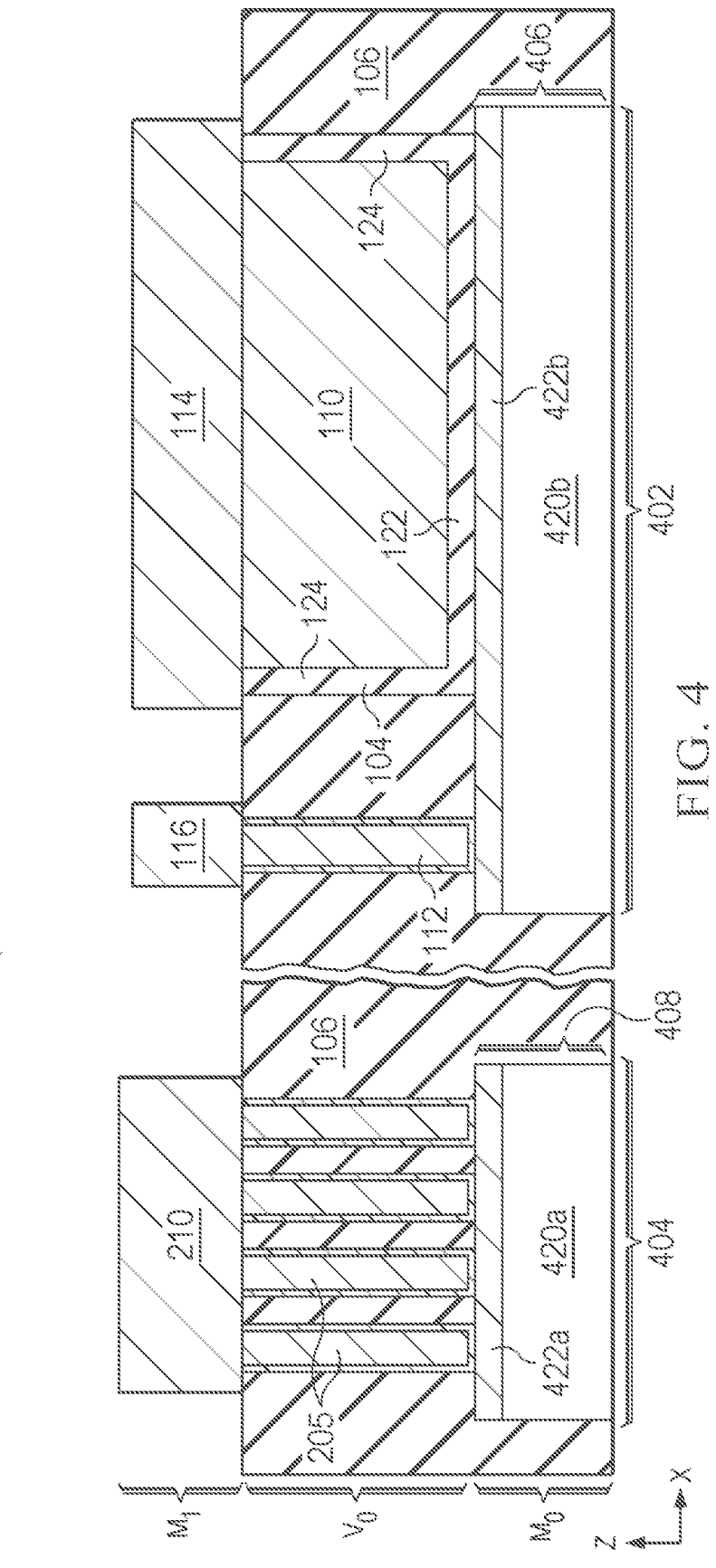
FIG. 4 is a side cross-sectional view showing an example IC structure including a MIM capacitor module and an interconnect structure formed on a lower metal layer comprising a silicided polysilicon layer.

FIG. 4 is a side cross-sectional view showing an example IC device 400 including an MIM capacitor module 402 and an IC structure 404 formed on a lower metal layer $M_0$ comprising a silicided polysilicon layer. In this example, a lower metal element 408 of IC structure 404 and a bottom electrode 406 of the MIM capacitor module 402 may respectively comprises a metal silicide formed on a respective polysilicon region. In particular, the lower metal element 408 comprises a first metal silicide 422a formed on a first polysilicon region 420a, and bottom electrode 406 comprises a second metal silicide 422b formed on a second polysilicon region 420b.

The invention claimed is:

1. A method, comprising:

forming a lower metal layer including a bottom electrode;

forming a dielectric region over the lower metal layer;

patterning and etching the dielectric region to form a tub opening and a bottom electrode contact opening in the dielectric region, each of the tub opening and bottom electrode contact opening exposing an upper surface of the bottom electrode;

depositing a conformal metal over the dielectric region, the deposited conformal metal (a) filling the bottom electrode contact opening to form a vertically-extending bottom electrode contact structure and (b) partially filling the tub opening;

performing a metal etch process that removes (a) portions of the conformal metal over the dielectric region and (b) the conformal metal in the tub opening, wherein the metal etch process also forms a recess in an upper portion of the vertically-extending bottom electrode contact structure that defines a recessed region of the vertically-extending bottom electrode contact structure, the recessed region having a vertical depth;

depositing an insulator layer over the dielectric region and forming an insulator cup structure in the tub opening, the insulator cup structure including a laterally extending insulator cup structure base formed on the bottom electrode and a vertically-extending insulator cup structure sidewall;

depositing a top electrode metal over the insulator layer and extending into an opening defined by the insulator cup structure;

performing a planarization process to remove (a) upper portions of the top electrode metal, (b) upper portions of the insulator layer, (c) a partial vertical thickness of the dielectric region, and (d) an upper portion of the vertically-extending bottom electrode contact structure in the bottom electrode contact opening, wherein the planarization process extends vertically below the vertical depth of the recessed region of the vertically-extending bottom electrode contact structure;

wherein after the planarization process, a remaining portion of the insulator layer defines an insulator cup, a remaining portion of the top electrode metal defines a top electrode, and a remaining portion of the vertically-extending bottom electrode contact structure defines a vertically-extending bottom electrode contact; and wherein the planarization process defines a planarized surface including a top surface of the insulator cup, a top surface of the top electrode, and a top surface of the vertically-extending bottom electrode contact; and forming an upper metal layer on the planarized surface, the upper metal layer including (a) a bottom electrode connection element electrically connected to the vertically-extending bottom electrode contact and (b) a top electrode connection element electrically connected to the top electrode.

2. The method of claim 1, wherein:

forming the dielectric region over the lower metal layer comprises forming the dielectric region including (a) a base component having a base component vertical thickness and (b) a sacrificial component over the base component and having a sacrificial component vertical thickness; and the planarization process removes the sacrificial component vertical thickness of the dielectric region.

3. The method of claim 1, wherein the deposited conformal metal forms a cup-shaped conformal metal structure in the tub opening.

4. The method of claim 1, wherein the lower metal layer and the upper metal layer respectively comprise metal interconnect layers.

5. The method of claim 1, wherein the lower metal layer comprises a silicided polysilicon layer, wherein the bottom electrode comprises a metal silicide formed on a polysilicon structure.

6. The method of claim 1, wherein the bottom electrode and the vertically-extending bottom electrode contact are formed from different metals.

7. The method of claim 1, wherein:

the bottom electrode is formed from aluminum; and the conformal metal forming the vertically-extending bottom electrode contact comprises tungsten.

8. The method of claim 1, wherein the vertically-extending insulator cup sidewall is formed directly on a vertically-extending surface of the dielectric region.

9. A method, comprising:

forming a lower metal layer including a bottom electrode;

forming a dielectric region over the lower metal layer;

forming a tub opening and a bottom electrode contact opening in the dielectric region;

depositing a conformal metal that (a) fills the bottom electrode contact opening to form a vertically-extending bottom electrode contact structure and (b) partially fills the tub opening;

performing a metal etch process that (a) removes the conformal metal in the tub opening, and (b) form a recessed region in an upper portion of the vertically-extending bottom electrode contact structure, the recessed region having a vertical depth;

forming an insulator cup structure in the tub opening;

depositing a top electrode metal in an opening defined by the insulator cup structure;

performing a planarization process extending vertically below the vertical depth of the recessed region in the upper portion of the vertically-extending bottom electrode contact structure;

wherein after the planarization process, a remaining portion of the insulator cup structure defines an insulator cup, a remaining portion of the top electrode metal defines a top electrode, and a remaining portion of the vertically-extending bottom electrode contact structure defines a vertically-extending bottom electrode contact; and forming an upper metal layer on the planarized surface, the upper metal layer including (a) a bottom electrode connection element electrically connected to the vertically-extending bottom electrode contact and (b) a top electrode connection element electrically connected to the top electrode.

10. The method of claim 9, wherein:

forming the dielectric region over the lower metal layer comprises forming the dielectric region including (a) a base component having a base component vertical thickness and (b) a sacrificial component over the base component and having a sacrificial component vertical thickness; and the planarization process removes the sacrificial component vertical thickness of the dielectric region.

11. The method of claim 9, wherein the deposited conformal metal forms a cup-shaped conformal metal structure in the tub opening.

12. The method of claim 9, wherein the lower metal layer and the upper metal layer respectively comprise metal interconnect layers.

13. The method of claim 9, wherein the lower metal layer comprises a silicided polysilicon layer, wherein the bottom electrode comprises a metal silicide formed on a polysilicon structure.

14. The method of claim 9, wherein the bottom electrode and the vertically- extending bottom electrode contact are formed from different metals.

15. The method of claim 9, wherein:

the bottom electrode is formed from aluminum; and the conformal metal forming the vertically-extending bottom electrode contact comprises tungsten.

* * * * *